United States Patent
Yagil et al.

(12) 
(10) Patent No.: US 11,454,894 B2
(45) Date of Patent: Sep. 27, 2022

(54) SYSTEMS AND METHODS FOR SCATTEROMETRIC SINGLE-WAVELENGTH MEASUREMENT OF MISREGISTRATION AND AMELIORATION THEREOF

(71) Applicant: KLA Corporation, Milpitas, CA (US)

(72) Inventors: Alon Yagil, Milpitas, CA (US); Yuval Lamhot, Haifa (IL); Ohad Bachar, Milpitas, CA (US); Martin Mayo, Milpitas, CA (US); Tal Yaziv, Milpitas, CA (US); Roie Volkovich, Hadera (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/161,604

(22) Filed: Jan. 28, 2021

(65) Prior Publication Data

US 2022/0082950 A1 Mar. 17, 2022

Related U.S. Application Data

(60) Provisional application No. 63/077,722, filed on Sep. 14, 2020.

(51) Int. Cl.
*G03F 7/20* (2006.01)
*G01B 11/06* (2006.01)
*H01L 21/66* (2006.01)

(52) U.S. Cl.
CPC ...... *G03F 7/70633* (2013.01); *G01B 11/0616* (2013.01); *G03F 7/70433* (2013.01); *H01L 22/12* (2013.01)

(58) Field of Classification Search
CPC .. G03F 7/70633; G03F 7/70433; G03F 7/705; G03F 9/7003; G01B 11/0616; H01L 22/12
See application file for complete search history.

(56) References Cited

U.S. PATENT DOCUMENTS

| | | |
|---|---|---|
| 9,869,543 B2 | 1/2018 | Bringoltz et al. |
| 10,203,200 B2 | 2/2019 | Marciano et al. |

(Continued)

FOREIGN PATENT DOCUMENTS

| | | |
|---|---|---|
| EP | 1570232 B1 | 11/2016 |
| WO | 2019182637 A1 | 9/2019 |
| WO | 2020197571 A1 | 10/2020 |

OTHER PUBLICATIONS

WIPO, ISR for PCT/US2021/016493, dated Jun. 10, 2021.

*Primary Examiner* — Peter B Kim
(74) *Attorney, Agent, or Firm* — Hodgson Russ LLP

(57) ABSTRACT

A method and system for measuring misregistration between different layers of a semiconductor device, the method including providing a set of pupil inaccuracy scalable basis elements (PISBEs) relating to a plurality of patterned semiconductor device wafers (PSDWs), generating a single pupil image of a site on a PSDW, the PSDW being one of the plurality of PSDWs, by taking a single measurement of the site, the single pupil image including a plurality of site-specific pixels, calculating a set of site-specific pupil inaccuracy scalable basis element scaling factors (PISBESFs) for the single pupil image using the set of PISBEs and the plurality of site-specific pixels and calculating a site-specific misregistration value (SSMV) using the set of PISBEs and the set of site-specific PISBESFs.

21 Claims, 4 Drawing Sheets

(56) References Cited

U.S. PATENT DOCUMENTS

| | | |
|---|---|---|
| 2009/0296075 A1 | 12/2009 | Hu et al. |
| 2015/0316490 A1 | 11/2015 | Amit et al. |
| 2016/0313658 A1 | 10/2016 | Marciano et al. |
| 2017/0052454 A1 | 2/2017 | Jak et al. |
| 2019/0155173 A1* | 5/2019 | Tsiatmas ............. G03F 7/70625 |

* cited by examiner

SYSTEMS AND METHODS FOR SCATTEROMETRIC SINGLE-WAVELENGTH MEASUREMENT OF MISREGISTRATION AND AMELIORATION THEREOF

REFERENCE TO RELATED APPLICATIONS

Reference is hereby made to U.S. Provisional Patent Application Ser. No. 63/077,722, filed Sep. 14, 2020 and entitled CALIBRATED MULTI SIGNAL SELF-ACCURACY METROLOGY, the disclosure of which is hereby incorporated by reference and priority of which is hereby claimed.

Reference is also made to the following patent and patent applications of the Applicant, which are related to the subject matter of the present application, the disclosures of which are hereby incorporated by reference:

U.S. Pat. No. 9,869,543 entitled REDUCING ALGORITHMIC INACCURACY IN SCATTEROMETRY OVERLAY METROLOGY;

U.S. Pat. No. 10,203,200 entitled ANALYZING ROOT CAUSES OF PROCESS VARIATION IN SCATTEROMETRY METROLOGY;

European Patent No. 1,570,232 entitled APPARATUS AND METHODS FOR DETECTING OVERLAY ERRORS USING SCATTEROMETRY;

PCT Patent Application No. PCT/US2018/049295, entitled OVERLAY MEASUREMENT USING MULTIPLE WAVELENGTHS; and PCT Application No. PCT/US2019/030776 entitled METHOD FOR MEASURING AND CORRECTING MISREGISTRATION BETWEEN LAYERS IN A SEMICONDUCTOR DEVICE, AND MISREGISTRATION TARGETS USEFUL THEREIN.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention, a method of measuring misregistration between different layers of a semiconductor device, the method including providing a set of pupil inaccuracy scalable basis elements (PISBEs) relating to a plurality of patterned semiconductor device wafers (PSDWs), generating a single pupil image of a site on a PSDW, the PSDW being one of the plurality of PSDWs, by taking a single measurement of the site, the single pupil image including a plurality of site-specific pixels, calculating a set of site-specific pupil inaccuracy scalable basis element scaling factors (PISBESFs) for the single pupil image using the set of PISBEs and the plurality of site-specific pixels and calculating a site-specific misregistration value (SSMV) using the set of PISBEs and the set of site-specific PISBESFs.

In accordance with a preferred embodiment of the present invention, the measuring of the site on the PSDW includes measuring the site using a single wavelength of incident radiation.

Preferably, the providing the set of PISBEs includes generating a plurality of reference pupil images from a corresponding plurality of reference measurements, the reference pupil images each including a plurality of reference pixels, and the plurality of reference measurements including at least a first reference measurement taken using a first wavelength of incident radiation and a second reference measurement taken using a second wavelength of incident radiation, identifying a plurality of reference pixel inaccuracies associated with corresponding the reference pixels of the reference pupil images and calculating the set of PISBEs using the reference pixel inaccuracies.

In accordance with a preferred embodiment of the present invention, the calculating the set of PISBEs includes calculating a set of representative pixel inaccuracies using the reference pixel inaccuracies, calculating a set of variations between the set of reference pixel inaccuracies and corresponding the set of representative pixel inaccuracies and calculating the set of PISBEs based on a set of principal components for the set of variations.

Preferably, the calculating the set of site-specific PISBESFs includes providing a set of systematic portions of a set of PISBESFs (SPSPs), approximating a set of site-specific residual portions (SSRPs) corresponding to the SPSPs and calculating the set of site-specific PISBESFs by adding together the set of SPSPs and corresponding the set of SSRPs.

In accordance with a preferred embodiment of the present invention, the SSMV is a function of the plurality of site-specific pixels, the set of PISBEs and a set of reference PISBESFs.

Preferably, the calculating the SSMV includes evaluating a first expression, the first expression being a function of a variable misregistration value and the set of SSRPs, evaluating a second expression, the second expression being a function of the set of SSRPs, and identifying, using the first expression and the second expression, the SSMV and a particular value of the set of SSRPs, which are particularly suitable for use with the site.

In a preferred embodiment of the present invention, the method also includes generating a key process indicator (KPI), the KPI providing an indication of a reliability of the SSMV.

Preferably, generating the KPI includes calculating a plurality of pixel misregistration values for the corresponding plurality of site-specific pixels of the single pupil image, calculating a weighting factor for each of the pixel misregistration values and calculating the KPI as a weighted standard deviation of the pixel misregistration values from the SSMV.

Preferably, the plurality of pixel misregistration values is a function of the set of PISBEs and the set of site-specific PISBESFs.

In accordance with a preferred embodiment of the present invention, the reference measurements measure a reference patterned semiconductor device wafer (RPSDW), the RPSDW and the PSDW being different wafers.

Alternatively, in accordance with a preferred embodiment of the present invention, the reference measurements measure a reference patterned semiconductor device wafer (RPSDW), the RPSDW and the PSDW being the same wafer.

In accordance with a preferred embodiment of the present invention, the method also includes using the SSMV in a fabrication process of a semiconductor device wafer.

There is also provided in accordance with another preferred embodiment of the present invention a system for measuring misregistration between different layers of a semiconductor device, the system including a reference scatterometry-based misregistration measurement tool (SMMT), operative to take at least two measurements of at least one reference site on at least one reference patterned semiconductor device wafer (RPSDW), thereby generating at least two reference output signals for each of the at least one reference site, an RPSDW analyzer, operative to analyze the reference output signals, thereby providing a set of pupil inaccuracy scalable basis elements (PISBEs) relating to a plurality of patterned semiconductor device wafers (PSDWs), a site-specific SMMT, operative to measure at least one measurement site on at least one PSDW, thereby generating a single pupil image of the measurement site, the PSDW being one of the plurality of PSDWs, and a PSDW analyzer, operative to analyze the single pupil image using the set of PISBEs, thereby generating a set of site-specific pupil inaccuracy scalable basis element scaling factors (PISBESFs) and a site-specific misregistration value (SSMV).

There is further provided in accordance with yet another preferred embodiment of the present invention a system for use with at least one scatterometry-based misregistration measurement tool (SMMT), the at least one SMMT being operative to measure at least one site on at least one reference patterned semiconductor device wafer (RPSDW) and at least one site on at least one patterned semiconductor device wafer (PSDW), the system including an RPSDW analyzer, operative to analyze a plurality of reference output signals generated by the measurement of the at least one RPSDW, thereby providing a set of pupil inaccuracy scalable basis elements (PISBEs) relating to the at least one PSDW, and a PSDW analyzer, operative to analyze, using the set of PISBEs, a single pupil image generated by the measurement of the PSDW, thereby generating a set of site-specific pupil inaccuracy scalable basis element scaling factors (PISBESFs) and a site-specific misregistration value (SSMV).

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
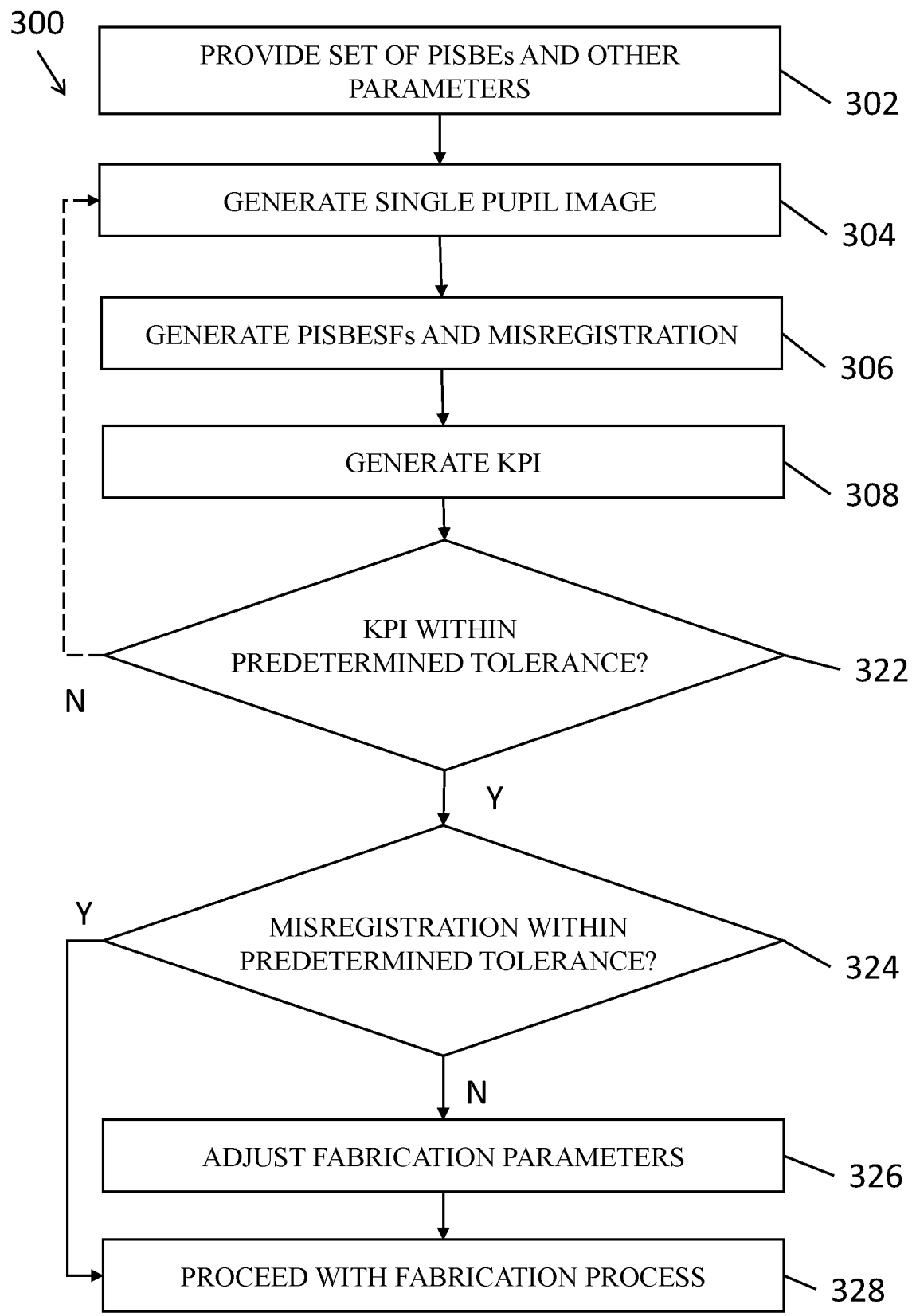
FIG. 1 is a simplified flowchart illustrating a preferred embodiment of the present invention.

It is appreciated that the systems and methods described hereinbelow with reference to FIGS. 1-5B are preferably used to measure misregistration between different layers of semiconductor devices and are part of a manufacturing process for semiconductor devices. The misregistration value calculated by the systems and methods described hereinbelow with reference to FIGS. 1-5B is preferably used to adjust fabrication processes, such as lithography, during the manufacturing of semiconductor devices, to ameliorate misregistration between various layers of the semiconductor devices being fabricated.

Typically, in the manufacture of semiconductor devices having multiple patterned layers, it is required that the various layers be maintained in strict spatial registration, preferably to within a tolerance of less than 10 nm, and more preferably to within a tolerance of less than 3 nm.

In order to maintain the spatial registration of the various layers of the semiconductor devices being formed on a patterned semiconductor device wafer (PSDW), misregistration is typically measured multiple times throughout a fabrication process of the semiconductor devices. Typically, an output signal from a misregistration measurement that is generated by a misregistration measurement tool includes a first portion, which is due to misregistration between at least two layers formed on the PSDW, and a second portion, which is due to noise, such as measurement inaccuracy. In order to calculate a misregistration value that is a good representation of a physical misregistration of a semiconductor device, it is advantageous to identify which portion of the output signal is due to measurement inaccuracy, so that portion can be removed from the output signal before calculating the misregistration value therefrom.

The methods and systems described hereinbelow with reference to FIGS. 1-5B are particularly suited for use with a scatterometry-based misregistration measurement tool (SMMT). A typical tool suitable as the SMMT is an ATL™ 100, commercially available from KLA Corporation of Milpitas, Calif., USA. It is a particular feature of the present invention that each measurement taken by the SMMT is taken using a single wavelength of incident radiation.

It is appreciated that as used herein, the terms "single wavelength of radiation" or "single wavelength of incident radiation" need not refer to radiation having exactly a single wavelength. Rather, the terms "single wavelength of radiation" or "single wavelength of incident radiation" each refer to radiation characterized by a narrow bandwidth of wavelengths, for example radiation that has a bandwidth of less than 25 nm, more preferably less than 15 nm and most preferably less than 10 nm. Such radiation is preferably characterized by a coherence length of 5 µm-100 µm. Additionally, such radiation preferably includes of a relatively small number, preferably fewer than 10, spatial modes.

The methods and systems described hereinbelow with reference to FIGS. 1-5B are preferably used to measure a plurality, most typically a pair, of periodic structures which at least partially overlie one another and are formed on the PSDW. Such periodic structures are typically formed as part of a target, such as one of the targets described in European Patent No. 1,570,232. In one embodiment of the present invention, the periodic structures are separate from functional semiconductor devices formed on the PSDW, and in another embodiment of the present invention, the periodic structures are included in the functional semiconductor devices, or portions thereof, formed on the PSDW. As described in more detail in European Patent No. 1,570,232, when the periodic structures are in a state of perfect registration, the periodic structures are offset from one another by a predetermined offset, $f_0$.

As described in more detail in U.S. Pat. No. 10,203,200, each misregistration measurement of the periodic structures by the SMMT produces an output signal, which is typically represented as a pupil image including a plurality, typically multiple thousands, of pixels. Each pixel is generated by a particular angle of reflected radiation, the reflected radiation being a reflection of the incident radiation by at least one of the periodic structures.

It is appreciated that the pupil image is preferably used to calculate a pupil misregistration value for the periodic structures. The pupil misregistration includes a plurality of pixel misregistration values, where each pixel misregistration value represents a misregistration value, typically with a unit of nanometers.

Typically, each pixel in the pupil image is characterized by a pixel asymmetry, K, and a pixel sensitivity, G. It is appreciated that for any particular pixel measured using incident radiation having some wavelength, $\lambda$:

$$K = \frac{D_1 + D_2}{2} \quad \text{(Eq. 1)}$$

and $$G = \frac{D_1 - D_2}{2} \quad \text{(Eq. 2)}$$

As is described in more detail in PCT Patent Application No. PCT/US2018/049295, $D_1$ is a difference in gray level intensity between a first pixel and a corresponding second pixel from the pupil image generated by radiation reflected by a first set of the periodic structures in the target. The first and second pixels respectively represent a $+1$ diffraction order and a $-1$ diffraction order of radiation reflected by the first set of the periodic structures. Similarly, $D_2$ is a difference in gray level intensity between a third pixel and a corresponding fourth pixel from the pupil image generated by radiation reflected by a second set of the periodic structures in the target. The third and fourth pixels respectively represent a $+1$ diffraction order and a $-1$ diffraction order of radiation reflected by the second set of the periodic structures.

There is a difference in gray level intensity between corresponding pixels of a+1 diffraction order and a−1 diffraction order from a second set of the periodic structures in the target.

Some methods of measuring misregistration of the periodic structures using an SMMT, such as the method disclosed in U.S. Pat. No. 9,869,543, hereinafter referred to as a single wavelength method (SWM), typically generate a misregistration of the periodic structures by taking one measurement of the periodic structures using a single wavelength of incident radiation. In such a method, the pupil misregistration of the periodic structures is given by Eq. 3:

$$\epsilon_{SWL} = f_0 \cdot \frac{K \cdot G}{G^2} \quad \text{(Eq. 3)}$$

where $\epsilon_{SWL}$ is the pupil misregistration calculated by the SWM, $f_0$ is the predetermined offset between the periodic structures, K is a pupil asymmetry, and G is a pupil sensitivity.

Other methods of measuring misregistration of the periodic structures using an SMMT, such as the method disclosed in PCT Patent Application No. PCT/US2018/049295, hereinafter referred to as a multi-wavelength method (MWM), typically generate a misregistration of the periodic structures by taking multiple measurements of the periodic structures, each measurement using a different single wavelength of incident radiation. In such a method, the pupil misregistration of the periodic structures is given by Eq. 4:

$$\epsilon_{MWL} = f_0 \cdot \frac{\Sigma_p \langle K_p \cdot G_p \rangle - \langle K_p \rangle \langle G_p \rangle}{\Sigma_{p'} \langle G_{p'}^2 \rangle - \langle G_{p'} \rangle^2} \quad \text{(Eq. 4)}$$

where $\epsilon_{MWL}$ is the pupil misregistration, $f_0$ is the predetermined offset between the periodic structures, p and p' are indices for pixels within pupil images and angled brackets, $\langle \ \rangle$, indicate an average taken over wavelengths used in the MWM. As explained more fully in PCT Patent Application No. PCT/US2018/049295, Eq. 4 is obtained by applying a pixel correction, $\delta A_{MWL}$, which is given by Eq. 5:

$$\delta A_{MWL}(pix) = \langle K_p \rangle - \frac{\epsilon_{MWL}}{f_0} \langle G_p \rangle \quad \text{(Eq. 5)}$$

where $K_p$ is the pixel asymmetry for the pixel being evaluated, $G_p$ is the pixel sensitivity for the pixel being evaluated, $\epsilon_{MWL}(pix)$ is the pupil misregistration from Eq. 4, $f_0$ is the predetermined offset between the periodic structures and angled brackets, $\langle \ \rangle$, indicate an average taken over wavelengths used in the MWM.

As is known in the art, the pupil misregistration generated by an SWM has a relatively large variation between different ones of the pixel misregistration values thereof as compared to variations between different ones of the pixel misregistration values of the pupil misregistration generated by an MWM. However, the pixels are correlated with reflection angles, and the periodic structures have a single physical misregistration which is not inherently dependent on an angle of reflection of radiation. Thus, the variations between pixel misregistration values generated by an SWM are indicative of noise, including undesired pixel inaccuracies.

In contrast, the pupil misregistration generated by an MWM is generated by removing at least some pixel inaccuracies from the pupil images. Therefore, variations between different ones of the pixel misregistration values thereof are relatively small as compared with variations between different ones of the pixel misregistration values by an SWM. The relatively small variations between the pixel misregistration values generated by an MWM indicate that pupil misregistration generated thereby is generally a more reliable indication of misregistration between the periodic structures than is the pupil misregistration generated by an SWM. However, as discussed hereinabove, an MWM measures misregistration of the periodic structures using multiple wavelengths of incident radiation. Therefore, an MWM requires taking multiple measurements of the periodic structures, which is a time-consuming process that impacts fabrication throughput, reducing a number of semiconductor devices that can be fabricated in a given amount of time.

The present invention seeks to provide improved, relatively fast systems and methods for the identification of pixel inaccuracies, pupil inaccuracies, pixel misregistration values and pupil misregistration. More particularly, the present invention preferably typically measures the periodic structures one time, using a single wavelength of incident radiation. In the present invention, the pixel misregistration values of the periodic structures are each given by Eq. 6:

$$\epsilon(pix) = f_0 \cdot \frac{K(pix) - \delta A(pix)}{G(pix)} \quad \text{(Eq. 6)}$$

where $\epsilon(pix)$ is the pixel misregistration value of the pixel being evaluated, $f_0$ is the predetermined offset between the periodic structures, $K(pix)$ is the pixel asymmetry for the pixel being evaluated, $G(pix)$ is the pixel sensitivity for the pixel being evaluated, and $\delta A(pix)$ is a pixel inaccuracy for the pixel being evaluated. As described in more detail hereinbelow with reference to FIGS. 1-4, the present invention spans the pixel inaccuracy, $\delta A(pix)$ using Eq. 7:

$$\delta A(pix) \approx \overline{\delta A}(pix) + \Sigma_\mu \alpha_\mu \cdot V_\mu(pix) \quad \text{(Eq. 7)}$$

where $\overline{\delta A}(pix)$ is a representative pixel inaccuracy, $\alpha_\mu$ is a pupil inaccuracy scalable basis element scaling factor (PISBESF) and $V_\mu(pix)$ is an element of a pupil inaccuracy scalable basis element (PISBE), $V_\mu$, corresponding to a particular pixel. It is appreciated that $\mu$ is an index for the respective PISBEs and PISBESFs being evaluated.

It is appreciated that the PISBEs are eigenvectors which relate to a plurality of patterned semiconductor device wafers (PSDWs). More particularly, the PISBEs form a useful basis from which to reconstruct a pupil inaccuracy for the pupil image generated by a measurement of the periodic structures.

Since the PISBEs are eigenvectors which span the pupil inaccuracy, the PISBEs form a useful basis from which to reconstruct a pupil inaccuracy, as is done in Eq. 7. As in Eq. 7, preferably, each of the PISBEs are multiplied by the PISBESF corresponding thereto, and the resulting products are added together, generating a site-specific portion of a pupil inaccuracy. Thereafter, the site-specific portion of pupil inaccuracy is added to the representative pupil inaccuracy, generating a total pupil inaccuracy.

It is appreciated that, just as the pupil image is formed of pixels and the pupil misregistration is formed of pixel misregistration values, each the PISBEs, representative pupil inaccuracy, and pupil inaccuracy are also formed of pixel-level data. As such, each of the PISBEs, representative pupil inaccuracy, and pupil inaccuracy is often advantageously represented as a matrix, where each matrix includes one element for each pixel.

As is well known in the art, typical PSDWs are manufactured to have many structures which are intended to be identical. Furthermore, a PSDW having a particular design is typically manufactured as part of a batch including a plurality of PSDWs having such a design, and a particular design is often used to manufacture multiple batches of PSDWs. It is appreciated that the PISBEs generated by the present invention are useful both for the periodic structures evaluated by Eq. 7 and for periodic structures which are similar thereto. Such similar periodic structures may be formed elsewhere on the same PSDW that is evaluated by equation 7, on other PSDWs of a single batch, or even on other PSDWs of a different batch, as long as the PSDWs is manufactured using the same particular design as the PSDW that is evaluated by equation 7.

Reference is now made to FIG. 1, which is a simplified flowchart illustrating a preferred embodiment of a method 300. As described hereinabove, method 300 is preferably part of a manufacturing process for semiconductor devices. It is appreciated that the illustrated portion of method 300 typically begins after the formation of at least two layers on the PSDW.

As seen in FIG. 1, at a first step 302, a set of pupil inaccuracy scalable basis elements (PISBEs) is provided. As described hereinabove, the PISBEs are eigenvectors which relate to a plurality of PSDWs. More particularly, the PISBEs form a useful basis from which to reconstruct a pupil inaccuracy for the pupil image generated by a measurement of the periodic structures. As further described hereinbelow with reference to FIG. 2, at step 402, a plurality of reference pupils is generated and analyzed.

In a preferred embodiment of the present invention, step 302 is performed once, for one or more reference patterned semiconductor device wafers (RPSDWs), generating a single set of results, and the single set of results generated at step 302 is used for multiple PSDWs that are processed using method 300. Thus, in a preferred embodiment of the present invention, step 302 is performed once, while the remaining steps of method 300 are performed for multiple PSDWs.

At a next step 304, a single pupil image of a site on the PSDW is generated. It is appreciated that as used herein, the term "site" refers to a portion of the PSDW suitable for misregistration measurement of the periodic structures. Preferably, the single pupil image is generated by taking a single measurement of the site with the SMMT, using a single wavelength of incident radiation. The pupil image generated by measuring the site preferably includes a plurality, typically multiple thousands, of site-specific pixels.

Thereafter, at a next step 306, a set of site-specific pupil inaccuracy scalable basis element scaling factors (PISBESFs) and a site-specific misregistration value (SSMV) are calculated for the single pupil image generated at step 304.

The site-specific PISBESFs are calculated using the set of PISBEs provided at step 302 and data from the site-specific pixels of the single pupil image generated at step 304. The SSMV is preferably calculated using the set of PISBEs provided at step 302 and the set of site-specific PISBESFs, which are calculated together with the SSMVs at step 306. Step 306 is further described hereinbelow with reference to FIG. 3.

Preferably, at a next step 308, a key process indicator (KPI) is generated. The KPI, which is typically embodied as a pupil 3σ (P3S) value, provides an indication, preferably a quantitative indication, of a reliability of the SSMV calculated at step 306. Step 308 is further described hereinbelow with reference to FIG. 4.

At a next step 322, the KPI generated at 308 is evaluated. In one embodiment of the present invention, if the KPI is not within a predetermined tolerance, method 300 returns to step 304 and another single pupil image of the site is generated. In other embodiments of the present invention, if the KPI is not within a predetermined tolerance, method 300 returns to step 304 and a single pupil image of different site on the PSDW is generated. In yet another embodiment of the present invention, if the KPI is not within a predetermined tolerance, method 300 is terminated.

if the KPI is within a predetermined tolerance, at a next step 324, the SSMV generated at step 306 is evaluated for use in a fabrication process of a semiconductor device wafer.

If the SSMV generated at step 306 is not within a predetermined tolerance, the SSMV generated at step 306 is used to generate an adjusted set of fabrication parameters at a next step 326. The adjusted set of fabrication parameters are preferably used to fabricate at least one layer of a PSDW, thereby ameliorating a misregistration between layers thereof, and at a next step 328, a fabrication process of the PSDWs continues.

If, however, at step 324 the SSMV generated at step 306 is found to be within a predetermined tolerance, then, at step 328, a fabrication process of the PSDWs continues without adjustment to fabrication parameters due to method 300.

Figure 2:
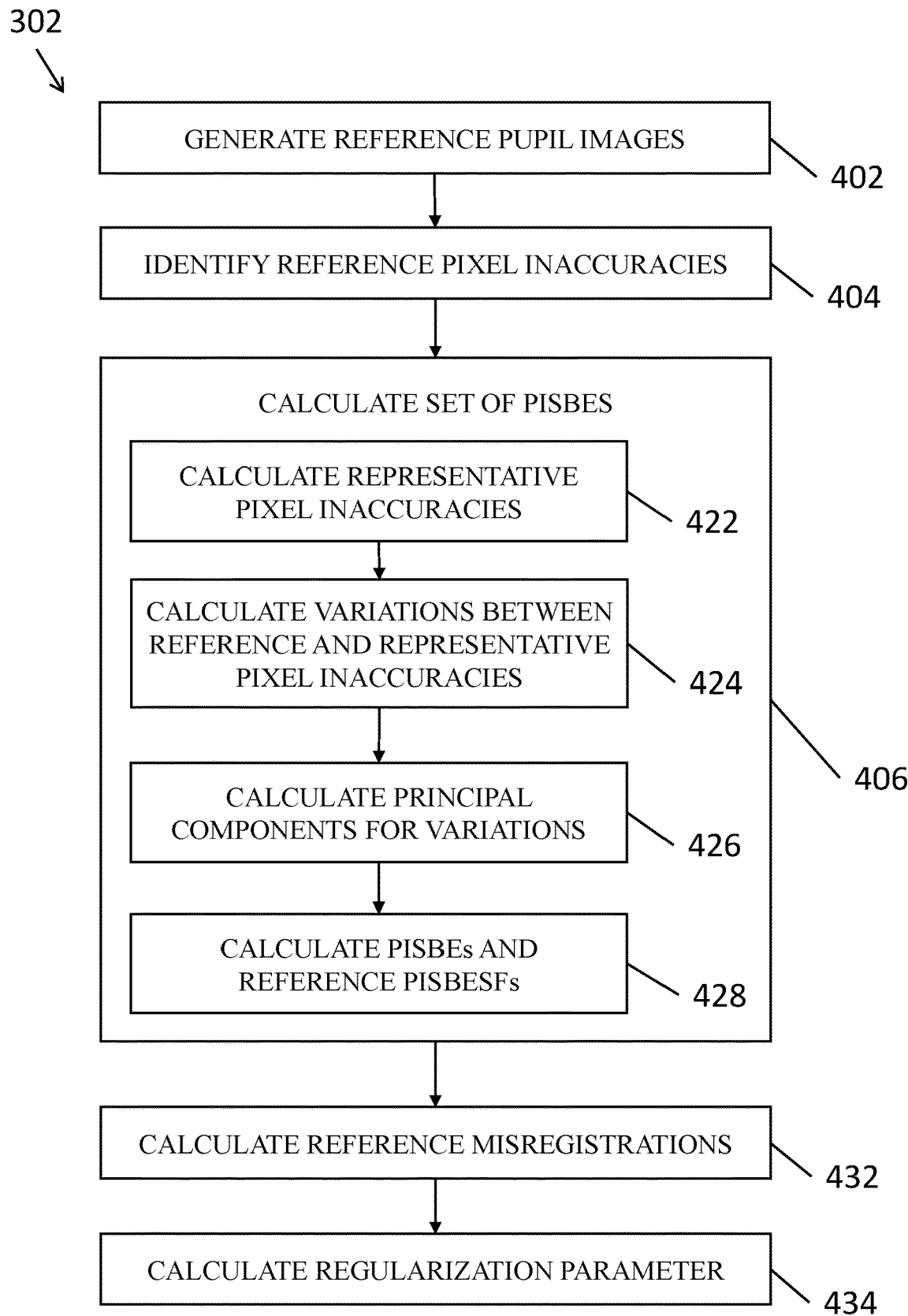
FIG. 2 is a simplified flowchart illustrating a portion of the embodiment of FIG. 1.

Reference is now made to FIG. 2, which is a simplified flowchart illustrating step 302 of method 300. As seen in FIG. 2, at a first step 402, a plurality of reference output signals is generated from a corresponding plurality of reference measurements. Preferably, the reference output signals are generated by an SMMT, and are represented as reference pupil images. Each of the reference pupil images preferably includes a plurality of reference pixels.

Preferably, the reference measurements taken at step 302 measure one or more RPSDWs. In one embodiment of the present invention, the at least one RPSDW measured at step 302 and the PSDW measured at step 304 are different wafers. In another embodiment of the present invention, the at least one RPSDW measured at step 302 and the PSDW measured at step 304 are the same wafer. However, the at least one RPSDW measured at step 302 and the PSDW measured at step 304 preferably share a single design. In one embodiment of the present invention, the at least one RPSDW measured at step 302 and the PSDW measured at step 304 are manufactured in a single batch of PSDWs.

In one embodiment of the present invention, the SMMT used in step 304 is the same SMMT that is used in step 402. In another embodiment of the present invention, different SMMTs are used in step 304 and step 402.

In one embodiment of the present invention, the plurality of reference measurements includes at least a first reference measurement of a single reference site, taken using a first single wavelength of incident radiation, and a second reference measurement of the single reference site, taken using a second single wavelength of incident radiation. In some embodiments of the present invention, additional reference measurements are taken of the single reference site, each additional measurement being taken using an additional single wavelength of incident radiation.

In an alternative embodiment of the present invention, the plurality of reference measurements includes a plurality of reference measurements of multiple reference sites. Preferably, each of the multiple reference sites is measured using at least two reference measurements. The at least two reference measurements are each taken using a single wavelength of incident radiation, and the single wavelength of incident radiation used in each reference measurement of a single reference site are different from one another. The total number of reference sites for which a reference pupil image is generated is referred to herein as $N_{sites}$.

In a preferred embodiment of the present invention, reference measurements are taken of 50-400 reference sites, using 2-7 wavelengths of incident radiation at each of the reference sites.

At a next step 404, a plurality of reference pixel inaccuracies, $\delta A_{ref}(pix)$, is identified. The plurality of reference pixel inaccuracies, $\delta A_{ref}(pix)$, are portions which contribute to asymmetry of a pixel, but which indicate measurement noise rather than misregistration of the site. As is known in the art, there are many ways to identify portions of a pupil image as belonging to the plurality of reference pixel inaccuracies, $\delta A_{ref}(pix)$, including, inter alia, comparing pupil image data to data generated by an electron-beam microscope, and comparing pupil data to data generated by calibration processes, such as the process described in PCT Application No. PCT/US2019/030776. It is appreciated that the reference pixel inaccuracies, $\delta A_{ref}(pix)$, are associated with corresponding reference pixels of the reference pupil images generated at step 402. Thereafter, at a next step 406, the set of PISBEs is calculated, using the reference pixel inaccuracies, $\delta A_{ref}(pix)$.

As shown in FIG. 2, step 406 includes a plurality of sub-steps. At a first sub-step 422, a set of representative pixel inaccuracies, $\overline{\delta A}(pix)$, is calculated using the reference pixel inaccuracies, $\delta A_{ref}(pix)$, identified at step 404. The calculation used at step 406 is given by Eq. 8, which calculates the set of representative pixel inaccuracies, $\overline{\delta A}(pix)$ for each pixel in the pupil image:

$$\overline{\delta A}(pix) = \frac{1}{N_{sites}} \Sigma_{sites} \delta A_{ref}(pix, \text{site}) \quad \text{(Eq. 8)}$$

where $N_{sites}$ is the total number of reference sites for which a reference pupil image was generated at step 402 and $\delta A_{ref}(pix, \text{site})$ is the reference pixel inaccuracy for a reference site for the pixel being evaluated.

It is appreciated that Eq. 8 calculates a mathematical mean of the reference pixel inaccuracies, $\delta A_{ref}(pix)$, identified at step 404 and uses the mathematical mean as a value for each representative pixel inaccuracy, $\overline{\delta A}(pix)$. It is appreciated, however, that other suitable manipulations of the reference pixel inaccuracies, $\delta A_{ref}(pix)$, may also be used to generate values for each representative pixel inaccuracy, $\overline{\delta A}(pix)$. For example, a median or mode of the reference pixel inaccuracies, $\delta A_{ref}(pix)$, identified at step 404 may be used as a value for each representative pixel inaccuracy, $\overline{\delta A}(pix)$. As a further example, a weighted mean, a weighted median or a weighted mode of the reference pixel inaccuracies, $\delta A_{ref}(pix)$, identified at step 404 may be used as a value for each representative pixel inaccuracy, $\overline{\delta A}(pix)$.

It is a particular feature of the present invention that the set of representative pixel inaccuracies, $\overline{\delta A}(pix)$, relate to a plurality of sites on a plurality of PDSWs. More particularly, the set of representative pixel inaccuracies, $\overline{\delta A}(pix)$, are useful in the reconstruction of a pupil inaccuracy for the pupil image generated by a measurement of the periodic structures.

At a next sub-step 424, a set of variations $\delta A_{var}(pix)$ between the set of reference pixel inaccuracies $\delta A_{ref}(pix)$ and the corresponding set of representative pixel inaccuracies $\overline{\delta A}(pix)$ is calculated using Eq. 9.

$$\delta A_{var}(pix) = \delta A_{ref}(pix) - \overline{\delta A}(pix) \quad \text{(Eq. 9)}$$

Thereafter, at a next sub-step 426, a set of principal components of the variations $\delta A_{var}(pix)$ is calculated using principal component analysis.

At a next sub-step 428, the set of PISBEs is calculated based on the set of principal components for the set of variations. It is a particular feature of the present invention that the variations, $\delta A_{var}(pix)$, may be expressed as a function of the set of PISBEs, $V_\mu$, and a corresponding set of reference PISBESFs, a ref, as in Eq. 10:

$$\delta A_{var}(pix) \approx \Sigma_\mu \alpha_{\mu\_ref} V_\mu(pix) \quad \text{(Eq. 10)}$$

where is an index for the reference PISBESFs, $\alpha_{\mu\_ref}$, and PISBEs, $V_\mu$, being evaluated. As discussed hereinbelow with reference to Eq. 11, the present invention seeks to provide a computationally advantageous representation of the reference pixel inaccuracies $\delta A_{ref}(\text{pix})$. Therefore, in order to reduce the number of terms that must be computed, some, but not all, elements $V_\mu(\text{pix})$ of PISBE $V_\mu$ are used in Eq. 10.

Eq. 11 below, which has the same form as Eq. 7, is algebraically equivalent to a combination of Eqs. 9 and 10:

$$\delta A_{ref\_calc}(\text{pix}) = \overline{\delta A}(\text{pix}) + \Sigma_\mu \alpha_{\mu\_ref} \cdot V_\mu(\text{pix}) \quad \text{(Eq. 11)}$$

where $\delta A_{ref\_calc}(\text{pix})$ is a calculated reference pixel inaccuracy for the pixel being evaluated, and the same $V_\mu(\text{pix})$ is used in both of Eqs. 10 & 11. It is appreciated that the representation of the set of reference pixel inaccuracies, $\delta A_{ref\_calc}(\text{pix})$, in Eq. 11 represents the set of reference pixel inaccuracies $\delta A_{ref}(\text{pix})$ using the PISBEs, $V_\mu$.

In other words, in Eq. 11, rather than accounting independently for each pixel in the set of reference pixel inaccuracies, $\delta A_{ref}(\text{pix})$, the set of reference pixel inaccuracies, $\delta A_{ref}(\text{pix})$, is replaced with the calculated set of reference pixel inaccuracies, $\delta A_{ref\_calc}(\text{pix})$, which is represented using a basis of the PISBEs, $V_\mu$. Since there are typically thousands of pixels and fewer than 100, and more typically fewer than 50, PISBEs, $V_\mu$, the representation of the calculated set of reference pixel inaccuracies, $\delta A_{ref\_calc}(\text{pix})$ in Eq. 11 is computationally advantageous when compared to accounting independently for each pixel in the set of reference pixel inaccuracies, $\delta A_{ref}(\text{pix})$.

Thus, at sub-step 428, method 300 provides the set of reference PISBESFs, $\alpha_{\mu\_ref}$, which are operative to be used together with the set of PISBEs, $V_\mu$, and the set of representative pixel inaccuracies, $\overline{\delta A}(\text{pix})$, to generate a calculated set of reference pixel inaccuracies, $\delta A_{ref\_calc}(\text{pix})$. Preferably, a plurality of corresponding differences between the calculated set of reference pixel inaccuracies, $\delta A_{ref\_calc}(\text{pix})$, and the set of reference pixel inaccuracies, $\delta A_{ref}(\text{pix})$, is within a predetermined tolerance.

The set of reference PISBESFs, $\alpha_{\mu\_ref}$, may be expressed as a sum of a corresponding set of systematic portions of the set of PISBESFs (SPSPs), $\alpha_\mu^s$, and a corresponding set of residual portions of the set of reference PISBESFs, $\alpha_{\mu\_ref}^r$, as in Eq. 12:

$$\alpha_{\mu\_ref} = \alpha_\mu^s + \alpha_{\mu\_ref}^r \quad \text{(Eq. 12)}$$

It is appreciated that the set of residual portions of the set of reference PISBESFs, $\alpha_{\mu\_ref}^r$, includes those portions of the set of reference PISBESFs, $\alpha_{\mu\_ref}$, which are not included in the set of SPSPs, $\alpha_\mu^s$. The set of residual portions of the reference PISBESFs, $\alpha_{\mu\_ref}^r$, is specific to the reference site corresponding to the set of reference PISBESFs, $\alpha_{\mu\_ref}$, from which the set of residual portions of the reference PISBESFs, $\alpha_{\mu\_ref}^r$, is identified. However, it is a particular feature of the present invention that the set of SPSPs, $\alpha_\mu^s$, relate to a plurality of sites on a plurality of PDSWs. More particularly, the set of SPSPs, $\alpha_\mu^s$, are useful in the reconstruction of a pupil inaccuracy for the pupil image generated by a measurement of the periodic structures.

In a preferred embodiment of the present invention, a distribution of the set of residual portions of the reference PISBESFs, $\alpha_{\mu\_ref}^r$, is approximated as a multivariate Gaussian distribution, which has a mean of zero and is characterized by a covariance matrix, $\Sigma_{\beta\gamma}$, which is defined in Eq. 13:

$$\Sigma_{\beta\gamma} = \langle \alpha_\beta^r \alpha_\gamma^r \rangle \quad \text{(Eq. 13)}$$

where $\beta$ and $\gamma$ are each an index for the set of residual portions of the reference PISBESFs, $\alpha_{\mu\_ref}^r$, and the brackets in Eq. 13 indicate that Eq. 13 takes an average of elements of the set of residual portions of the reference PISBESFs, $\alpha_{\mu\_ref}^r$, which are calculated for each of the reference sites.

As is known in the art, the covariance matrix, $\Sigma_{\beta\gamma}$, is a square matrix that quantifies the covariance between each pair of elements, $\alpha_\beta^r$ and $\alpha_\gamma^r$, of the set of residual portions of the reference PISBESFs, $\alpha_{\mu\_ref}^r$. Thus, the covariance matrix, $\Sigma_{\beta\gamma}$, is a measure of the joint variability of $\alpha_\beta^r$ and $\alpha_\gamma^r$.

As shown in Eq. 14, at sub-step 428, the set of SPSPs, $\alpha_\alpha^s$, is provided by modeling the set of reference PISBESFs, $\alpha_{\mu\_ref}$, and fitting the model with a function g such that:

$$\alpha_\mu^s = g(c2tx, c2ty, \text{fieldX}, \text{fieldY}) \quad \text{(Eq. 14)}$$

where c2tx and c2ty, are respective x- and y-coordinates of a pixel within the PSDW and fieldX and fieldY are respective x- and y-coordinates of the pixel within a field. As is known in the art, a typical PSDW is divided into fields, such as dies, and each field on the PSDW is typically intended to be generally identical to most or all of the other fields on the PSDW.

The function g may be any suitable function, and is most typically a polynomial of the form $W^n F^m$, where n is a polynomial order associated with a location on the PSDW, c2tx and c2ty, and m is a polynomial order associated with a location within the field, fieldX and fieldY. The function g typically includes polynomial coefficients, which are calculated using linear regression.

It is appreciated that elements in the set of reference PISBESFs, $\alpha_{\mu\_ref}$, are uncorrelated to one another, and thus the model for each reference PISBESF, $\alpha_{i\_ref}$, in the set of set of reference PISBESFs, $\alpha_{\mu\_ref}$, may be fit separately.

The set of SPSPs, $\alpha_\mu^s$, is indicative of a correlation between various sites on a single PSDW. For example, if a first site on a particular PSDW is characterized by pixel inaccuracies, $\delta A(\text{pix})$, having relatively large values, then a second site on that PSDW is likely also characterized by pixel inaccuracies, $\delta A(\text{pix})$, having relatively large values. As another example, if a first site on a particular PSDW is characterized by pixel inaccuracies, $\delta A(\text{pix})$, having relatively small values, then a second site on that PSDW is likely also characterized by pixel inaccuracies, $\delta A(\text{pix})$, having relatively small values.

The correlation between individual pixels of a single pupil image is indicative of a redundancy in the pupil representation of pixel inaccuracies, $\delta A(\text{pix})$. The set of PISBEs, $V_\mu$, exploits this redundancy to provide a computationally advantageous representation of pixel inaccuracies, $\delta A(\text{pix})$.

At a next step 432, misregistration is calculated for each reference site using both Eq. 4, generating a value for the pupil misregistration, $\epsilon_{EWL}$, and Eq. 6, generating values for each pixel misregistration value, $\epsilon(\text{pix})$.

At a next step 434, a regularization parameter, $\zeta$, is calculated to minimize Eq. 15:

$$\zeta = \arg\min_\zeta \{\Sigma_{sites} | \epsilon_{MQL} - (\zeta \cdot \epsilon) | \} \quad \text{(Eq. 15)}$$

where $\Sigma_{sites}$ indicates that the expression is summed over each reference site, and $\epsilon$ is a pupil misregistration value based on the pixel misregistration values, $\epsilon(\text{pix})$, generated at step 432.

Figure 3:
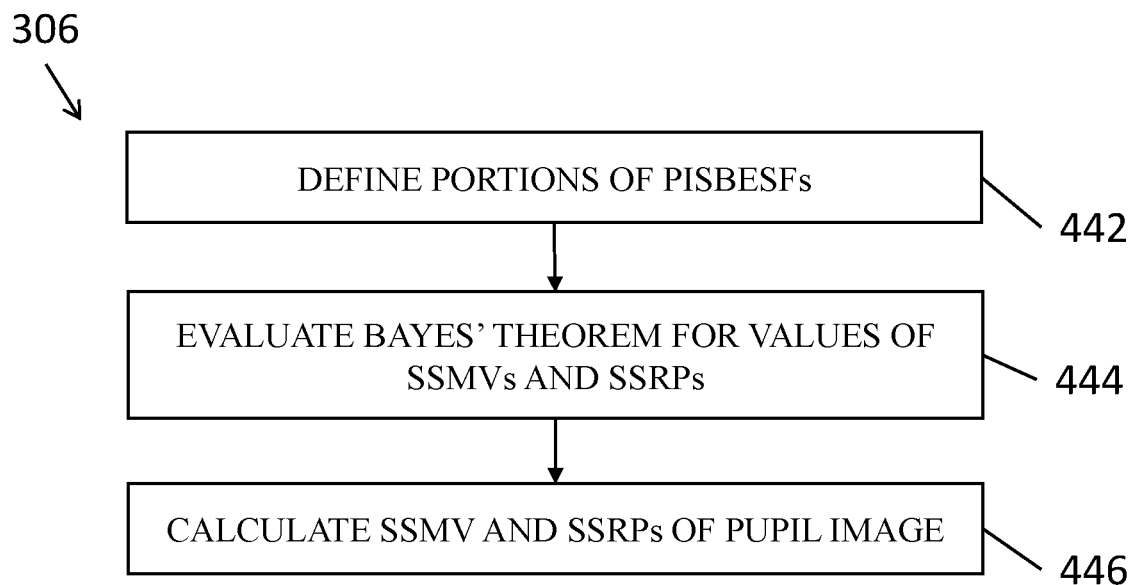
FIG. 3 is a simplified flowchart illustrating a portion of the embodiment of FIGS. 1 & 2.

Reference is now made to FIG. 3, which is a flowchart illustrating step 306 of method 300, at which the set of site-specific PISBESFs, $\alpha_\mu$, and the SSMV, $\epsilon$, for the single pupil image generated at step 304 are calculated. At a first step 442, the set of site-specific PISBESFs, $\alpha_\mu$, being generated at step 306 is set to satisfy Eq. 16, which is a site-specific representation of Eq. 12:

$$\alpha_\mu = \mu_\mu^s + \alpha_\mu^r \quad \text{(Eq. 16)}$$

where $\mu_\mu^s$ is the set of SPSPs generated at sub-step 428, and $\alpha_\mu^r$ is a corresponding set of site-specific residual portions (SSRPs) of the set of site-specific PISBESFs, $\alpha_\mu$. Thus, by evaluating Eq. 16, the set of site-specific PISBESFs, $\alpha_\mu$, are calculated by adding together the set of SPSPs, $\alpha_\mu^s$, and the corresponding set of SSRPs, $\alpha_\mu^r$.

At a next step 444, the SSMV, ϵ, and the set of site-specific PISBESFs, $\alpha_\mu$, are preferably calculated together, by evaluating how Eq. 17, which is a representation of Bayes' Theorem, changes for different values of the SSMV, ϵ, and the set of SSRPs, $\alpha_\mu^r$.

$$P(\epsilon, \alpha_\mu^r \mid G, K) = \frac{P(G, K \mid \epsilon, \alpha_\mu^r) P(\alpha_\mu^r)}{P(G, K)} \quad \text{(Eq. 17)}$$

where G is the pupil sensitivity of the pupil image generated at step 304 and K is the pupil asymmetry of the pupil image generated at step 340. Additionally, $P(\epsilon,\alpha_\mu^r|G,K)$ is a probability that, given a pupil image having a particular value for pupil sensitivity G and a particular value for pupil asymmetry K, a particular SSMV, ϵ, and a particular set of SSRPs, $\alpha_\mu^r$, are associated with that pupil image. Similarly, $P(G,K|\epsilon,\alpha_\mu^r)$ is a probability that, given a particular value for SSMV, ϵ, and a particular set of values for set of SSRPs, $\alpha_\mu^r$, a particular pupil image having a particular value for pupil sensitivity G and a particular value for pupil asymmetry K is associated with the particular given respective values for SSMV, ϵ, and set of SSRPs, $\alpha_\mu^r$. The next term in Eq. 17, $P(\alpha_\mu^r)$ is a probability that a particular set of SSRPs, $\alpha_\mu^r$, is associated with any pupil image, and $P(G,K)$ is a probability of a particular value for pupil sensitivity, G, and a particular value for pupil asymmetry, K, are associated with any pupil image.

It is appreciated that, during the evaluation of Eq. 11, the SSRPs, $\alpha_\mu^r$, corresponding to the SPSPs, $\alpha_\mu^s$, are approximated.

Since, as described hereinabove with reference to Eqs. 12 & 13, the distribution of the set of residual portions of the PISBESFs, $\alpha_{\mu\_ref}^r$, is preferably approximated as a multivariate Gaussian distribution, the value of $P(G,K|\epsilon,\alpha_\mu^r)$ is proportional to an exponential expression given in Eq. 18:

$$P(G, K \mid \epsilon, \alpha_\mu^r) P(\alpha_\mu^r) \propto \quad \text{(Eq. 18)}$$
$$\exp\left(-\frac{1}{2\sigma^2} \Sigma_i \left(K_i - \overline{\delta A} - (\alpha_\mu^s + \alpha_\mu^r) V_i^\mu - \frac{\epsilon}{f_0} G_i\right)^2\right)$$

where σ is a standard deviation of the noise of the pupil image generated at step 304, $K_i$ is the pixel asymmetry for the pixel being evaluated, $V_i^\mu$ is an $i^{th}$ element of the PISBE, $V_\mu$, and $G_i$ is the pixel sensitivity for the pixel being evaluated. It is appreciated that both $K_i$ and $G_i$ are values of the pupil image generated at step 304.

Similarly, a value of $P(\alpha_\mu^r)$ is inferred from the distribution of the set of residual portions of the PISBESFs, $\alpha_{\mu\_ref}^r$, found at sub-step 428, as described hereinabove with reference to FIG. 2. More specifically, the value of $P(\alpha_\mu^r)$ is proportional to an exponential expression given in Eq. 19:

$$P(\alpha_\mu^r) \propto \exp(-\tfrac{1}{2} \Sigma_{j,k} \alpha_j^r \Sigma_{jk}^{-1} \alpha_k^r) \quad \text{(Eq. 19)}$$

where j and k are each an index for the set of SSRPs, $\alpha_\mu^r$, and $\Sigma_{jk}^{-1}$ is of an element of an inverse of the covariance matrix, Σ.

Since value of $P(G,K)$ is not dependent on either of the SSMV, ϵ, and the set of SSRPs, $\alpha_\mu^r$, $P(G,K)$ is taken to be an unknown constant that does not affect how Eq. 17 changes for different values of the SSMV, ϵ, and the set of SSRPs, $\alpha_\mu^r$. Therefore, an actual value of $P(G,K)$ is typically not considered when Eq. 17 is evaluated at step 306.

Eq. 20 below is algebraically equivalent to a combination of Eqs. 7 and 16. Eq. 20 explicitly gives a relationship between the set of pixel inaccuracies, $\delta A(\text{pix})$, and the set of SSRPs, $\alpha_\mu^r$:

$$\delta A(\text{pix}) \approx \underline{\delta A}(\text{pix}) + \Sigma_\mu (\alpha_\mu^s + \alpha_\mu^r) \cdot V_\mu(\text{pix}) \quad \text{(Eq. 20)}$$

As discussed hereinabove with reference to FIG. 2, the set of representative pixel inaccuracies, $\underline{\delta A}(\text{pix})$, the set of SPSPs, $\alpha_\mu^s$, and each element, $V_\mu(\text{pix})$, of the PISBEs, $V_\mu$, are all calculated for reference sites at step 302. As described hereinabove, it is a particular feature of the present invention that the values calculated at step 302 for the set of representative pixel inaccuracies, $\overline{\delta A}(\text{pix})$, the set of SPSPs, $\alpha_\mu^s$, and each element, $V_\mu(\text{pix})$, of the PISBEs, $V_\mu$, all relate to a plurality of PSDWs. More particularly, the values calculated at step 302 for the set of representative pixel inaccuracies, $\overline{\delta A}(\text{pix})$, the set of SPSPs, $\alpha_\mu^s$, and each element, $V_\mu(\text{pix})$, of the PISBEs, $V_\mu$, are all suitable for use in Eq. 20. Thus, at step 306, the only values that method 300 must calculate in order to find the set of pixel inaccuracies, $\delta A(\text{pix})$, are those of the set of SSRPs, $\alpha_\mu^r$.

Therefore, although the goal of step 306 is to calculate values of the SSMV, ϵ, and the set of pixel inaccuracies, $\delta A(\text{pix})$, which are particularly suitable for use with the pupil image generated at step 304, a next step 446 calculates values of the SSMV, ϵ, and the set of SSRPs, $\alpha_\mu^r$, which are used in place of pixel inaccuracies, δA, in the right-hand side of Eq. 21:

$$(\in, \delta A) = \text{argMax}_{\in, \alpha_\mu^r} \{P(\in, \alpha_\mu^r | G, K)\} \quad \text{(Eq. 21)}$$

Eq. 22 is algebraically equivalent to a weighted combination of Eqs. 17, 18, 19 and 21:

$$(\epsilon, \delta A) = \quad \text{(Eq. 22)}$$
$$\text{argMax}_{\epsilon,\alpha_\mu^r} \left\{ \exp\left(\left(-\frac{1}{2\sigma^2} \Sigma_i\left(K_i - \overline{\delta A} - (\alpha_\mu^s + \alpha_\mu^r) V_i^\mu - \frac{\epsilon}{f_0} G_i\right)^2\right) + \zeta \cdot \left(1 - \frac{1}{2} \Sigma_{j,k} \alpha_j^r \Sigma_{jk}^{-1} \alpha_k^r\right)\right) \cdot C \right\}$$

where C is a reciprocal of the unknown constant value of $P(G,K)$, as described hereinabove, and ζ is the regularization parameter from Eq. 15, which is introduced in Eq. 22 in order to determine a weight given to $P(\alpha_\mu^r)$ of Eq. 19 relative to $P(\in,\alpha_\mu^r|G,K)$ of Eq. 17.

The same results for the SSMV, ϵ, and the set of SSRPs, $\alpha_\mu^r$, are returned by both of Eqs. 22 & 23:

$$(\epsilon, \delta A) = \text{argMax}_{\epsilon,\alpha_\mu^r} \left\{ \left(-\Sigma_i\left(K_i - \overline{\delta A} - (\alpha_\mu^s + \alpha_\mu^r) V_i^\mu - \frac{\epsilon}{f_0} G_i\right)^2\right) - \quad \text{(Eq. 23)} \right.$$
$$\left. (\zeta \cdot (\Sigma_{j,k} \alpha_j^r \Sigma_{jk}^{-1} \alpha_k^r)) \right\}$$

It is appreciated that first expression, $$\left(-\Sigma_i\left(K_i - \overline{\delta A} - (\alpha_\mu^s + \alpha_\mu^r) V_i^\mu - \frac{\epsilon}{f_0} G_i\right)^2\right),$$

is a function of a variable misregistration value of the SSMV, $\epsilon$, and the set of SSRPs, $\alpha_\mu^r$. Similarly, second expression, $(\zeta \cdot (\Sigma_{j,k} \alpha_j^r \Sigma_{jk}^{-1} \alpha_k^r))$, is a function of the set of SSRPs, $\alpha_\mu^r$.

The values of SSMV, $\epsilon$, and the set of SSRPs, $\alpha_\mu^r$, which satisfy Eq. 23 also satisfy the system of Eqs. 24a and 24b:

$$\frac{\partial}{\partial \alpha_\mu^r}\left\{\left(-\Sigma_i\left(K_i - \overline{\delta A} - (\alpha_\mu^s + \alpha_\mu^r)V_i^\mu - \frac{\epsilon}{f_0}G_i\right)^2\right) - \right. \quad \text{(Eq. 24a)}$$
$$\left. \zeta \cdot (\Sigma_{j,k} \alpha_j^r \Sigma_{jk}^{-1} \alpha_k^r)\right\} = 0$$

$$\frac{\partial}{\partial \epsilon}\left\{\left(-\Sigma_i\left(K_i - \overline{\delta A} - (\alpha_\mu^s + \alpha_\mu^r)V_i^\mu - \frac{\epsilon}{f_0}G_i\right)^2\right) - \right. \quad \text{(Eq. 24b)}$$
$$\left. \zeta \cdot (\Sigma_{j,k} \alpha_j^r \Sigma_{jk}^{-1} \alpha_k^r)\right\} = 0$$

It is appreciated that an evaluation of Eqs. 24a and 24b identifies, using the first expression and the second expression of Eq. 23, a particular misregistration value and a particular value of the set of SSRPs, $\alpha_\mu^r$, which are particularly suitable for use with the site measured at step 304. Since Eq. 23 is a second-order polynomial in terms of both $\alpha_\mu^r$ and $\epsilon$, each of Eqs. 24a and 24b is a linear equation which equal zero. Method 300 preferably solves the system of Eqs. 24a and 24b, thereby generating Eq. 25:

$$\epsilon = f_0 \frac{(K \cdot G) - (G \cdot V_\beta)^T \cdot (I + \zeta \cdot \Sigma_{\beta\gamma}^{-1})^{-1} \cdot (K \cdot V_\gamma)}{G^2 - (G \cdot V_\beta)^T \cdot (I + \zeta \cdot \Sigma_{\beta\gamma}^{-1})^{-1} \cdot (G \cdot V_\gamma)} \quad \text{(Eq. 25)}$$

I is an identity matrix. It is appreciated that the subscript $\mu$ in the set of PISBEs, $V_\mu$, is an index corresponding to the number of PISBEs, $V_\mu$, in the set of PISBEs, $V_\mu$. For clarity, in Eq. 25, indices $\beta$ and $\gamma$ are used in place of the index $\mu$. The value of SSMV, $\epsilon$, returned by Eq. 25 is the particular misregistration identified by evaluation Eq. 24a and 24b, and is preferably identified as the SSMV, $\epsilon$, for the site measured at step 304.

It is further appreciated that the value of SSMV, $\epsilon$, returned by Eq. 25 is a function of the plurality of site-specific pixels generated at step 304, particularly of the asymmetry, K, and sensitivity, G, thereof. The value of SSMV, $\epsilon$, returned by Eq. 25 is also a function of the set of PISBEs, $V\mu$, and the covariance matrix, $\Sigma_{\beta\gamma}$. As demonstrated in Eq. 13, the covariance matrix, $\Sigma_{\beta\gamma}$, is a function of the set of reference PISBESFs, $\alpha_{\mu\_ref}$, and more particularly of the set of residual portions of the reference PISBESFs, $\alpha_{\mu\_ref}^r$. Thus, the value of SSMV, $\epsilon$, returned by Eq. 25 is also a function of the set of reference PISBESFs, $\alpha_{\mu\_ref}$, and more particularly of the set of residual portions of the reference PISBESFs, $\alpha_{\mu\_ref}^r$.

Figure 4:
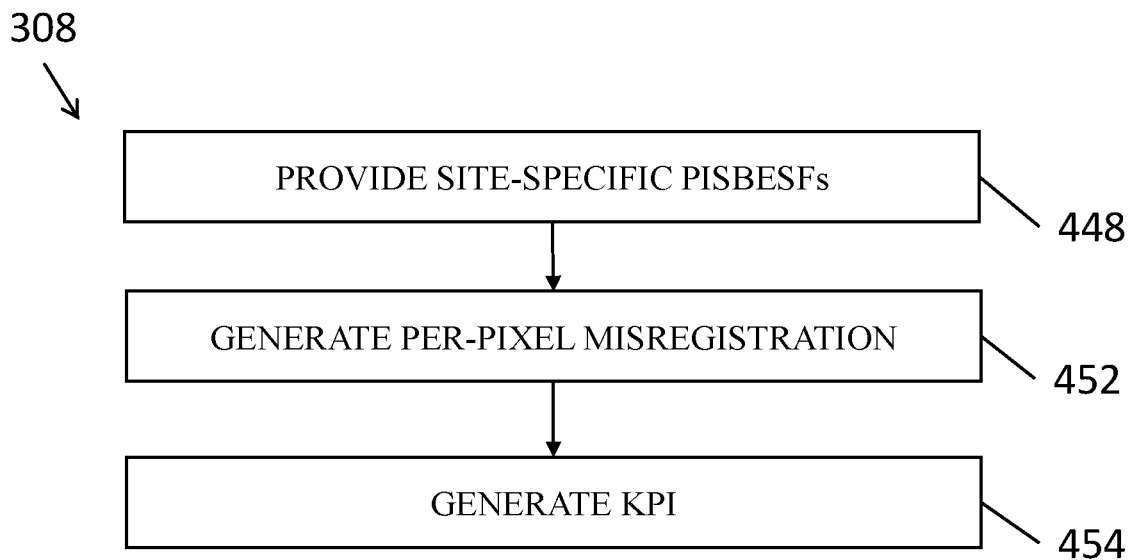
FIG. 4 is a simplified flowchart illustrating a portion of the embodiment of FIGS. 1-3.

Reference is now made to FIG. 4, which is a flowchart illustrating step 308 of method 300, at which the KPI, preferably a 3PS value, is generated. As seen in FIG. 4, at a first step 448, the set of site-specific PISBESFs, $\alpha_\mu$, is provided. The set of site-specific PISBESFs, $\alpha_\mu$, is defined in Eq. 26:

$$\alpha_\beta = (I + \zeta \cdot \Sigma_{\beta\gamma}^{-1})^{-1} \cdot \left(K - \overline{\delta A} - \frac{\epsilon}{f_0}G\right) \cdot V_\gamma + \alpha_\beta^s \quad \text{(Eq. 26)}$$

where the values of the set of representative pixel inaccuracies, $\underline{\delta A}$, are the values thereof calculated at step 302, and the values of all other terms on the right-hand-side of Eq. 26 are the same respective values as in Eq. 25. It is appreciated that the subscript $\mu$ in the set of site-specific PISBESFs, $\alpha_\mu$, and in the set of PISBEs, $V_\mu$, is an index corresponding to the number of PISBESFs, $\alpha_\mu$, and PISBEs, $V_\mu$, in the set of PISBESFs, $\alpha_\mu$, and PISBEs, $V_\mu$. For clarity, in Eq. 26, indices $\beta$ and $\gamma$ are used in place of the index $\mu$.

At a next step 452, a plurality of the pixel misregistration values, $\epsilon$(pix), for the corresponding plurality of site-specific pixels of the single pupil image generated at step 304, is generated using Eq. 27, which is algebraically equivalent to a combination of Eqs. 6 & 7:

$$\epsilon(pix) = f_0 \cdot \frac{K(pix) - \overline{\delta A}(pix) - V_\mu(pix) \cdot \alpha_\mu}{G(pix)} \quad \text{(Eq. 27)}$$

It is appreciated that the plurality of the pixel misregistration values, $\epsilon$(pix), is a function of, inter alia, the set of PISBEs, $V_\mu$, and the set of site-specific PISBESFs, $\alpha_\mu$.

As discussed hereinabove with reference to the SWM and MWM, variations between different ones of pixel misregistration values, $\epsilon$(pix), are an indication of unreliability of the SSMV, which includes the pixel misregistration values, $\epsilon$(pix). Therefore, at a next step 454 a KPI is generated. Preferably, the KPI generated at step 454 is the P3S defined in Eq. 28:

$$P3S = 3\sqrt{\Sigma_{pix}(\epsilon(pix) - \epsilon)^2 w(pix)} \quad \text{(Eq. 28)}$$

where $\epsilon$ is the SSMV from Eq. 25, and w(pix) is a weighting factor for the pixel misregistration value, $\epsilon$(pix). The weighting factor, w(pix), indicates a reliability of the pixel misregistration value, $\epsilon$(pix) at each of the site-specific pixels. It is appreciated that the P3S defined in Eq. 28 is a weighted standard deviation of the pixel misregistration values, $\epsilon$(pix), from the SSMV, $\epsilon$.

In a preferred embodiment of the present invention, the weighting factor w(pix) of each of the site-specific pixels is a function of the pixel sensitivity, G(pix), of the pixel being evaluated, as in Eq. 29:

$$w(pix) = \frac{(G(pix))^2}{\Sigma_{pix}(G(pix))^2}, \quad \text{(Eq. 29)}$$

Figure 5A:
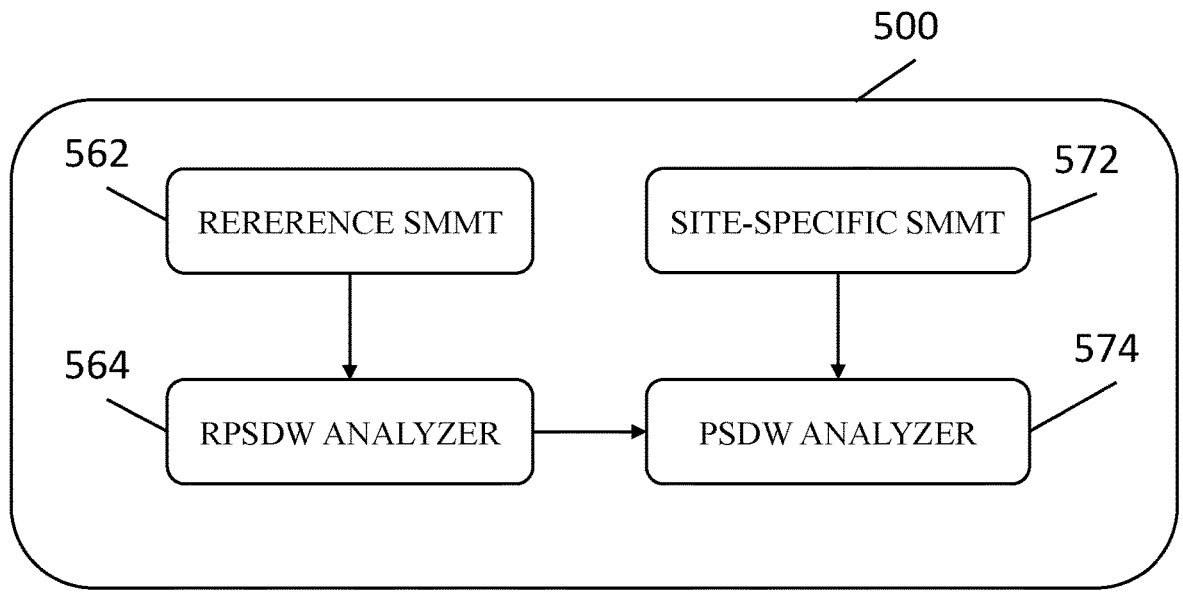
FIG. 5A is a simplified schematic illustration of a preferred embodiment of a system for use with the embodiment of FIGS. 1-4.
Figure 5B:
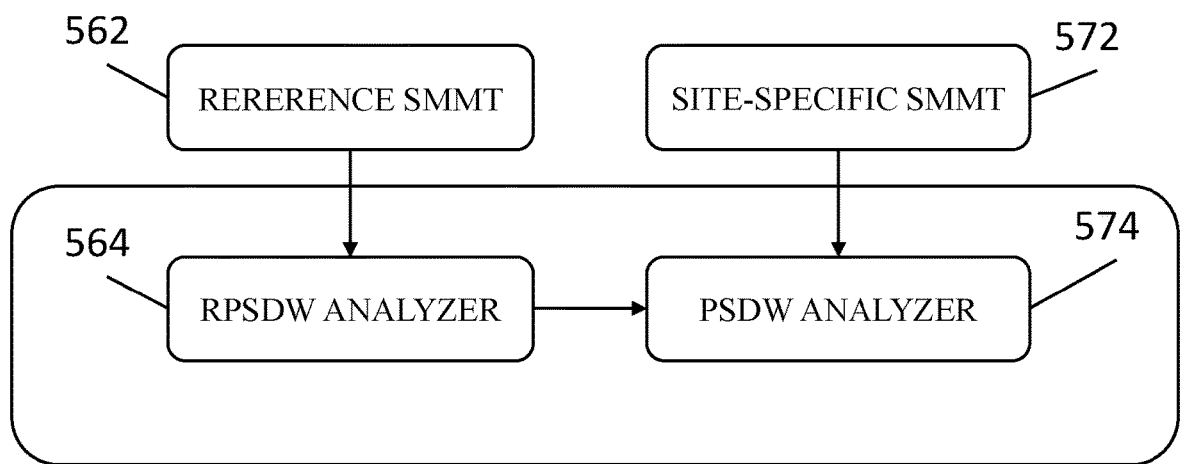
FIG. 5B is a simplified schematic illustration of another preferred embodiment of a system for use with the embodiment of FIGS. 1-4.

Reference is now made to FIGS. 5A & 5B, which are, respectively, a first and second simplified schematic diagram of a preferred embodiment of respective systems 500 and 550 for use with method 300 of FIGS. 1-4. It is appreciated that, for ease of understanding, FIGS. 1A & 1B are not drawn to scale. It is appreciated that each of systems 500 and 550 is operative to measure misregistration between different layers of a semiconductor device formed on a PSDW, which may be an RPSDW.

As seen in FIGS. 5A & 5B, each of system 500 and system 550 preferably a includes a reference SMMT 562, which takes at least two measurements of at least one reference site on the one or more RPSDWs, using at least a first wavelength of incident radiation and a second wavelength of incident radiation, generating a single reference output signal from each of the first wavelength of incident radiation and the second wavelength of incident radiation for each reference site measured. As described hereinabove with reference to step 402 of FIG. 2, the reference output signals generated by SMMT 562 are preferably represented as a plurality of pupil images, each of which preferably includes a plurality of reference pixels.

In a preferred embodiment of the present invention, SMMT 562 measures 50-400 reference sites, using 2-7 wavelengths of incident radiation at each of the reference sites.

Additionally, system 500 and system 550 preferably each include an RPSDW analyzer 564. RPSDW analyzer 564 analyzes the reference output signals generated by reference SMMT 562, thereby generating reference output data. The reference output data generated by RPSDW analyzer preferably includes, inter alia, the set of PISBEs, $V_\mu$, the representative pupil inaccuracy, $\delta A$, the set of reference PISBESFS, $\alpha_{\mu\_ref}$, the set of SPSPs, $\alpha_\mu^s$, the covariance matrix, $\tau_{\beta\gamma}$, and the regularization parameter, $\zeta$. As described hereinabove with reference to FIG. 1, the PISBEs are eigenvectors which relate to a plurality of PSDWs.

Each of system 500 and system 550 preferably further includes a site-specific SMMT 572, which measures at least one measurement site on each of the PSDWs, generating at least one site-specific output signal of the measurement site. The site-specific output signal, as described hereinabove with reference to step 304 of FIG. 1, is preferably a single pupil image of the measurement site.

Preferably, system 500 and system 550 each also include a PSDW analyzer 574. PSDW analyzer 574 analyzes the single pupil image generated by the site-specific SMMT 572, thereby generating, inter alia, the set of site-specific PISBESFs, $\alpha_\mu$, the SSMV, $\epsilon$, the pixel misregistration values, $\epsilon$(pix), and the KPI, P3S. As described hereinabove with reference to step 308 of FIGS. 1 & 4, the KPI is typically embodied as a P3S value and provides an indication, preferably a quantitative indication, of a reliability of the SSMV. PSDW analyzer 574 preferably analyzes the single pupil image using the reference output data generated by RPSDW analyzer 564 and provided thereby, including, inter alia, the set of PISBEs, $V\mu$.

A typical tool suitable as both reference SMMT 562 and site-specific SMMT 572 is an ATL™ 100, commercially available from KLA Corporation of Milpitas, Calif., USA. It is a particular feature of the present invention that every measurement taken by the SMMT is taken using a single wavelength of incident radiation.

It is appreciated that system 500, illustrated in FIG. 5A, differs from system 550, illustrated in FIG. 5B, in that system 500 includes reference SMMT 562 and site-specific SMMT 572, while system 550 does not include reference SMMT 562 and site-specific SMMT 572. In an additional embodiment of the present invention (not shown), only one of reference SMMT 562 and site-specific SMMT 572 is included in the system.

It is further appreciated that, as described hereinabove with reference to FIG. 2, the at least one RPSDW measured by the reference SMMT and the PSDW measured by the site-specific SMMT may be different wafers. Alternatively, the at least one RPSDW measured by the reference SMMT may be one of the PSDWs measured by the site-specific SMMT. Preferably, in all embodiments of the present invention, the at least one RPSDW measured by the reference SMMT and the PSDW measured by the site-specific SMMT share a single design. In an embodiment of the present invention, the at least one RPSDW measured by the reference SMMT and the PSDW measured by the site-specific SMMT are manufactured in a single batch of PSDWs.

Preferably, reference SMMT 562 performs step 402 of FIG. 2. Similarly, RPSDW analyzer 564 preferably performs step 404, step 406, including sub-steps 422, 424, 426 and 428, step 432 and step 434 of FIG. 2. Site-specific SMMT 572 preferably performs step 304 of FIG. 1. PSDW analyzer 574 preferably performs step 306, including steps 442, 444 and 446, and step 308, including steps 448, 452 and 454. Additionally, in some embodiments of the present invention, PSDW analyzer 574 performs at least one of steps 322 and 324 of FIG. 1.

The systems 500 and 550 and the sub-systems therein can include a personal computer system, image computer, mainframe computer system, workstation, network appliance, internet appliance, or other device. The sub-system(s) or system(s) may also include any suitable processor known in the art, such as a parallel processor. In addition, the sub-system(s) or system(s) may include a platform with high speed processing and software, either as a standalone or a networked tool.

In some embodiments, various steps, functions, and/or operations of systems 500 and 550 and the sub-systems therein and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor (or computer system) or, alternatively, multiple process (or multiple computer systems). Moreover, different sub-systems of the systems 500 and 550 may include one or more computing or logic systems. Therefore, the above description should not be interpreted as a limitation on the present disclosure but merely an illustration.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

What is claimed is:

1. A method of measuring misregistration between different layers of a semiconductor device, the method comprising:
   providing a set of pupil inaccuracy scalable basis elements (PISBEs) relating to a plurality of patterned semiconductor device wafers (PSDWs);
   generating a single pupil image of a site on a PSDW, said PSDW being one of said plurality of PSDWs, by taking a single measurement of said site, said single pupil image comprising a plurality of site-specific pixels;
   calculating a set of site-specific pupil inaccuracy scalable basis element scaling factors (PISBESFs) for said single pupil image using said set of PISBEs and said plurality of site-specific pixels; and
   calculating a site-specific misregistration value (SSMV) using said set of PISBEs and said set of site-specific PISBESFs.

2. The method according to claim 1, wherein said measuring of said site on said PSDW comprises measuring said site using a single wavelength of incident radiation from a scatterometry-based misregistration measurement tool.

3. The method according to claim 1, wherein said providing said set of PISBEs comprises:
generating a plurality of reference pupil images from a corresponding plurality of reference measurements, said reference pupil images each comprising a plurality of reference pixels, and said plurality of reference measurements comprising at least a first reference measurement taken using a first wavelength of incident radiation and a second reference measurement taken using a second wavelength of incident radiation;
identifying a plurality of reference pixel inaccuracies associated with corresponding said reference pixels of said reference pupil images; and
calculating said set of PISBEs using said reference pixel inaccuracies.

4. The method according to claim 3, wherein said calculating said set of PISBEs comprises:
calculating a set of representative pixel inaccuracies using said reference pixel inaccuracies;
calculating a set of variations between said set of reference pixel inaccuracies and corresponding said set of representative pixel inaccuracies; and
calculating said set of PISBEs based on a set of principal components for said set of variations.

5. The method according to claim 3, wherein said calculating said set of site-specific PISBESFs comprises:
providing a set of systematic portions of a set of PISBESFs (SPSPs);
approximating a set of site-specific residual portions (SSRPs) corresponding to said SPSPs; and
calculating said set of site-specific PISBESFs by adding together said set of SPSPs and corresponding said set of SSRPs.

6. The method according to claim 1, wherein said SSMV is a function of:
said plurality of site-specific pixels;
said set of PISBEs; and
a set of reference PISBESFs.

7. The method according to claim 6, wherein said calculating said SSMV comprises:
evaluating a first expression, said first expression being a function of a variable misregistration value and said set of SSRPs;
evaluating a second expression, said second expression being a function of said set of SSRPs; and
identifying, using said first expression and said second expression, said SSMV and a particular value of said set of SSRPs for use with said site.

8. The method according to claim 1, further comprising generating a key process indicator (KPI), said KPI providing an indication of a reliability of said SSMV, wherein generating said KPI comprises:
calculating a plurality of pixel misregistration values for said corresponding plurality of site-specific pixels of said single pupil image;
calculating a weighting factor for each of said pixel misregistration values; and
calculating said KPI as a weighted standard deviation of said pixel misregistration values from said SSMV.

9. The method according to claim 8, wherein said plurality of pixel misregistration values is a function of said set of PISBEs and said set of site-specific PISBESFs.

10. The method according to claim 1, wherein said reference measurements measure a reference patterned semiconductor device wafer (RPSDW), said RPSDW and said PSDW being different wafers.

11. The method according to claim 1, wherein said reference measurements measure a reference patterned semiconductor device wafer (RPSDW), said RPSDW and said PSDW being the same wafer.

12. The method according to claim 1, further comprising using said SSMV in a fabrication process of a semiconductor device wafer.

13. A system for measuring misregistration between different layers of a semiconductor device, the system comprising:
a reference scatterometry-based misregistration measurement tool (SMMT), operative to take at least two measurements of at least one reference site on at least one reference patterned semiconductor device wafer (RPSDW), thereby generating at least two reference output signals for each of said at least one reference site;
an RPSDW analyzer, operative to analyze said reference output signals, thereby providing a set of pupil inaccuracy scalable basis elements (PISBEs) relating to a plurality of patterned semiconductor device wafers (PSDWs);
a site-specific SMMT, operative to measure at least one measurement site on at least one PSDW, thereby generating a single pupil image of said measurement site, said PSDW being one of said plurality of PSDWs; and
a PSDW analyzer, operative to analyze said single pupil image using said set of PISBEs, thereby generating:
a set of site-specific pupil inaccuracy scalable basis element scaling factors (PISBESFs); and
a site-specific misregistration value (SSMV).

14. The system according to claim 13, wherein said site-specific SMMT measures said at least one site on said at least one PSDW using a single wavelength of incident radiation.

15. The system according to claim 13, wherein said reference SMMT is operative to:
measure each of said at least one site on said at least one RPSDW using at least a first wavelength of incident radiation and a second wavelength of incident radiation; and
generate a single reference output signal from each of said first wavelength of incident radiation and said second wavelength of incident radiation.

16. The system according to claim 13, wherein said RPSDW and said PSDW are different wafers.

17. The system according to claim 13, wherein said RPSDW and said PSDW are the same wafer.

18. A system for use with at least one scatterometry-based misregistration measurement tool (SMMT), said at least one SMMT being operative to measure at least one site on at least one reference patterned semiconductor device wafer (RPSDW) and at least one site on at least one patterned semiconductor device wafer (PSDW), the system comprising:
an RPSDW analyzer, operative to analyze a plurality of reference output signals generated by said measurement of said at least one RPSDW, thereby providing a set of pupil inaccuracy scalable basis elements (PISBEs) relating to said at least one PSDW; and
a PSDW analyzer, operative to analyze, using said set of PISBEs, a single pupil image generated by said measurement of said PSDW, thereby generating:
a set of site-specific pupil inaccuracy scalable basis element scaling factors (PISBESFs); and
a site-specific misregistration value (SSMV).

19. The system according to claim 18, wherein said single pupil image is generated by a measurement using a single wavelength of incident radiation, of said PSDW.

20. The system according to claim 18, wherein said RPSDW and said PSDW are different wafers.

21. The system according to claim 18, wherein said RPSDW and said PSDW are the same wafer.

\* \* \* \* \*